United States Patent
Salter et al.

(10) Patent No.: US 12,078,116 B2
(45) Date of Patent: Sep. 3, 2024

(54) VEHICLE ELECTRICAL SYSTEM

(71) Applicant: Ford Global Technologies, LLC, Dearborn, MI (US)

(72) Inventors: Stuart C. Salter, White Lake, MI (US); Alasdair Collins, Billericay (GB); Yukiyasu Nagata, Northville, MI (US); Gabriel Jim, Canton, MI (US); Malcolm Fry, Hertford/Hertfordshire (GB); Kelvin Howard, Romford (GB); Hanyang Chen, Canton, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 112 days.

(21) Appl. No.: 17/467,609

(22) Filed: Sep. 7, 2021

(65) Prior Publication Data
US 2023/0070318 A1   Mar. 9, 2023

(51) Int. Cl.
| | | |
|---|---|---|
| *F02D 35/00* | (2006.01) | |
| *G01R 31/392* | (2019.01) | |
| *G07C 5/00* | (2006.01) | |

(52) U.S. Cl.
CPC ....... *F02D 35/0007* (2013.01); *G01R 31/392* (2019.01); *G07C 5/008* (2013.01)

(58) Field of Classification Search
CPC ....... B60L 58/16; G01R 31/392; G07C 5/008; F02N 2200/061; F02N 11/0807
USPC ......................................................... 701/113
See application file for complete search history.

(56) References Cited

U.S. PATENT DOCUMENTS

| | | |
|---|---|---|
| 5,767,658 A | 6/1998 | Hayes |
| 6,545,445 B1 | 4/2003 | McDermott et al. |
| 6,583,599 B1 * | 6/2003 | Phillips ................ B60W 10/08 320/103 |
| 7,151,326 B2 | 12/2006 | Jordan |
| 9,452,720 B2 | 9/2016 | Brey |
| 10,168,364 B2 | 1/2019 | Chakravarty |
| 10,879,710 B2 | 12/2020 | Park |

(Continued)

FOREIGN PATENT DOCUMENTS

| | | | |
|---|---|---|---|
| CN | 112072700 A | * | 12/2020 |
| DE | 102016207033 A1 | | 10/2017 |

(Continued)

OTHER PUBLICATIONS

Non-Final Office Action dated Mar. 5, 2024 re U.S. Appl. No. 17/392,597, filed Aug. 3, 2021.

*Primary Examiner* — Logan M Kraft
*Assistant Examiner* — Joshua Campbell
(74) *Attorney, Agent, or Firm* — Frank Lollo; Bejin Bieneman PLC (57) ABSTRACT

A vehicle electrical system includes a battery, a customer connection point, a switch electrically connected in series between the battery and the customer connection point, a computer communicatively coupled to the switch, and a transceiver communicatively coupled to the computer. The computer is programmed to instruct the switch to open in response to a state of charge of the battery decreasing below a charge threshold, receive an input selecting a time limit, and instruct the transceiver to transmit a message to a remote server upon determining that the state of charge of the battery will decrease below the charge threshold in less than the time limit from a current time.

18 Claims, 4 Drawing Sheets

(56) References Cited

U.S. PATENT DOCUMENTS

| | | |
|---|---|---|
| 2006/0058897 A1 | 3/2006 | Senda et al. |
| 2008/0100258 A1 | 5/2008 | Ward |
| 2008/0143292 A1 | 6/2008 | Ward |
| 2011/0221384 A1 | 9/2011 | Scheucher |
| 2011/0248667 A1 | 10/2011 | Umeoka |
| 2012/0176096 A1* | 7/2012 | Mumelter ............... B60L 58/24 320/134 |
| 2012/0306266 A1 | 12/2012 | Ohnuki |
| 2013/0193753 A1* | 8/2013 | Brey .................. H02J 7/0032 307/10.7 |
| 2014/0225620 A1* | 8/2014 | Campbell ............... B60L 58/12 324/426 |
| 2015/0244165 A1* | 8/2015 | Roesner ................ H02H 3/087 361/79 |
| 2017/0106819 A1 | 4/2017 | Richardson et al. |
| 2017/0356963 A1* | 12/2017 | Petrucelli ............... G01K 13/00 |
| 2018/0137762 A1* | 5/2018 | Lee ........................ B60T 8/00 |
| 2018/0238289 A1* | 8/2018 | Khonizi ................ H04L 67/303 |
| 2018/0297476 A1 | 10/2018 | Malek et al. |
| 2019/0249635 A1* | 8/2019 | Khafagy ............... F02N 11/084 |
| 2020/0114764 A1 | 4/2020 | Johnson |
| 2021/0162867 A1 | 6/2021 | Clay et al. |
| 2023/0044009 A1 | 9/2023 | Salter et al. |

FOREIGN PATENT DOCUMENTS

| | | | |
|---|---|---|---|
| JP | 201667142 A | | 4/2016 |
| JP | 2016067142 A | * | 4/2016 |
| JP | 6730167 B2 | | 7/2020 |

\* cited by examiner

VEHICLE ELECTRICAL SYSTEM

BACKGROUND

Motor vehicles typically include at least one battery. Types of batteries include lithium-ion batteries, nickel-metal hydride batteries, and lead-acid batteries. The battery is used to start the motor of the vehicle. When the operator turns the ignition, current from the battery is provided to a solenoid switch causing the solenoid switch to close and electrically connect the battery to a starter. The starter converts the electrical energy from the battery into rotational kinetic energy to start the motor.

DETAILED DESCRIPTION

A vehicle electrical system includes a battery, a customer connection point, a switch electrically connected in series between the battery and the customer connection point, a computer communicatively coupled to the switch, and a transceiver communicatively coupled to the computer. The computer is programmed to instruct the switch to open in response to a state of charge of the battery decreasing below a charge threshold, receive an input selecting a time limit, and instruct the transceiver to transmit a message to a remote server upon determining that the state of charge of the battery will decrease below the charge threshold in less than the time limit from a current time.

The computer may be programmed to determine a state of health of the battery, and determine the charge threshold based on the state of health of the battery. The charge threshold may increase as the state of health of the battery decreases.

The battery may be a second battery, the switch may be a second switch, the vehicle electrical system may further include a first battery and a first switch electrically connected in series between the first battery and the second battery. The first switch may be configured to be open in response to an ignition of a vehicle including the vehicle electrical system being off.

The first switch may be electrically connected in series between the first battery and the second switch.

The vehicle electrical system may further include an ignition electrically connected to the first battery, and the first battery may be configured to supply power to a starter in response to a signal from the ignition.

The message may be a first message, and the computer may be further programmed to determine a state of health of the battery, and instruct the transceiver to transmit a second message to the remote server in response to the state of health of the battery being below a health threshold.

The computer may be further programmed to start an ignition of a vehicle including the vehicle electrical system in response to the state of charge of the battery decreasing below the charge threshold.

The input may be a first input, and the computer may be further programmed to receive a second input selecting whether to start an ignition of a vehicle including the vehicle electrical system in response to the state of charge of the battery decreasing below the charge threshold, start the ignition in response to the state of charge of the battery decreasing below the charge threshold and the second input selecting to start the ignition, and refrain from starting the ignition in response to the state of charge of the battery decreasing below the charge threshold and the second input selecting to not start the ignition.

The message may be a first message, and the computer may be programmed to determine a rate of discharge of the battery, and instruct the transceiver to transmit a second message to the remote server in response to the rate of discharge being above a rate threshold.

The message may be a first message, the time limit may be a first time limit, and the computer may be programmed to instruct the transceiver to transmit a second message to the remote server upon determining that the state of charge of the battery will decrease below the charge threshold in less than a second time limit from the current time. The second time limit may be less than the first time limit.

The input may contain a selection of the first time limit from a range from a smallest time to a greatest time, and the second time limit may be less than the smallest time.

The second time limit may be predetermined.

The remote server may be a mobile device associated with a vehicle including the vehicle electrical system.

Receiving the input may include receiving the input from the remote server via the transceiver.

The vehicle electrical system may further include a plurality of customer connection points including the customer connection point, and the switch may be electrically connected in series between the battery and the plurality of customer connection points.

The switch may be a relay.

With reference to the Figures, wherein like numerals indicate like parts throughout the several views, a vehicle electrical system 102 for a vehicle 100 includes a second battery 104, at least one customer connection point 106, a second switch 108 electrically connected in series between the second battery 104 and the at least one customer connection point 106, a computer 110 communicatively coupled to the second switch 108, and a transceiver 134 communicatively coupled to the computer 110. The computer 110 is programmed to instruct the second switch 108 to open in response to a state of charge of the second battery 104 decreasing below a charge threshold, receive an input selecting a first time limit, and instruct the transceiver 134 to transmit a message to a remote server upon determining that the state of charge of the second battery 104 will decrease below the charge threshold in less than the first time limit from a current time.

The customer connection points 106 permit an operator to connect nonvehicle loads to the vehicle electrical system 102. The second battery 104 provides power to the nonvehicle loads even when an ignition 112 of the vehicle 100 is off. (As described below, the vehicle 100 can include a first battery 114 separated from the second battery 104 by a first switch 116, and the first battery 114 can be used to start the vehicle 100.) Using the second switch 108 to disconnect the customer connection point 106 from the second battery 104 at the charge threshold can prevent a deep discharge of the second battery 104, and fewer deep discharges can increase a lifespan of the second battery 104. The message by the computer 110 keeps the operator apprised of the status of the second battery 104 even at a remote location, permitting the second battery 104 to be used when the vehicle 100 is off and the operator is away from the vehicle 100 with reduced risk of the second battery 104 running out of energy.

Figure 1:
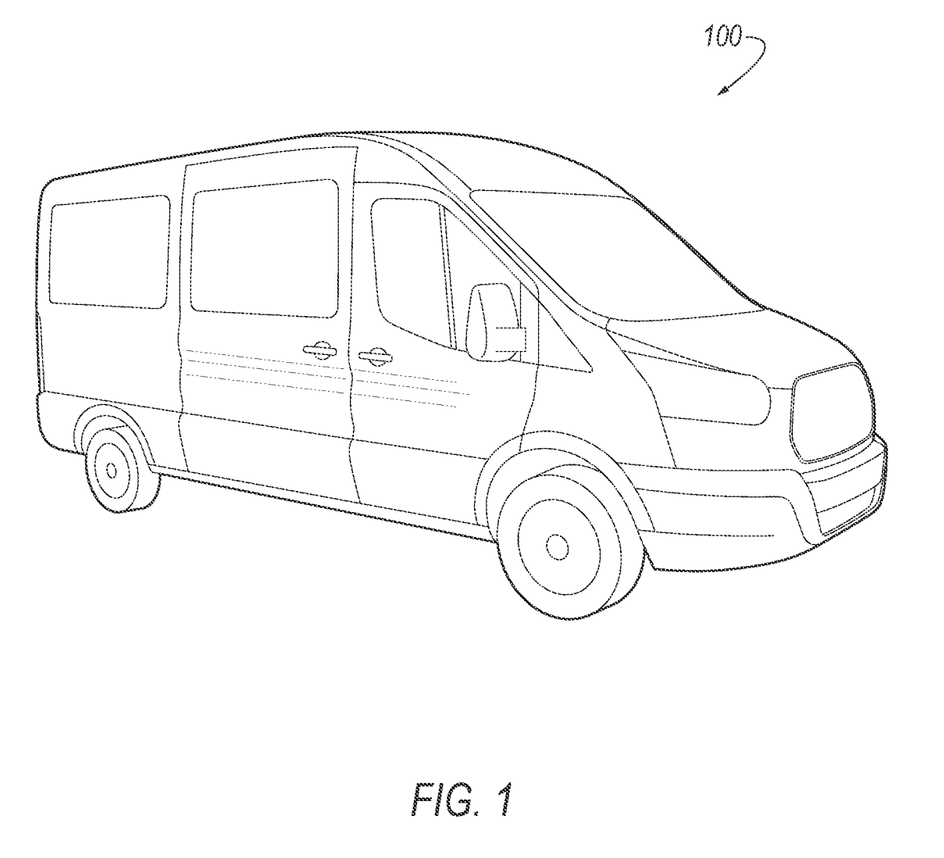
FIG. 1 is a perspective view of an example vehicle.

With reference to FIG. 1, the vehicle 100 may be any suitable type of ground vehicle, e.g., a passenger or commercial automobile such as a sedan, a coupe, a truck, a sport utility, a crossover, a van, a minivan, a taxi, a bus, etc.

Figure 2:
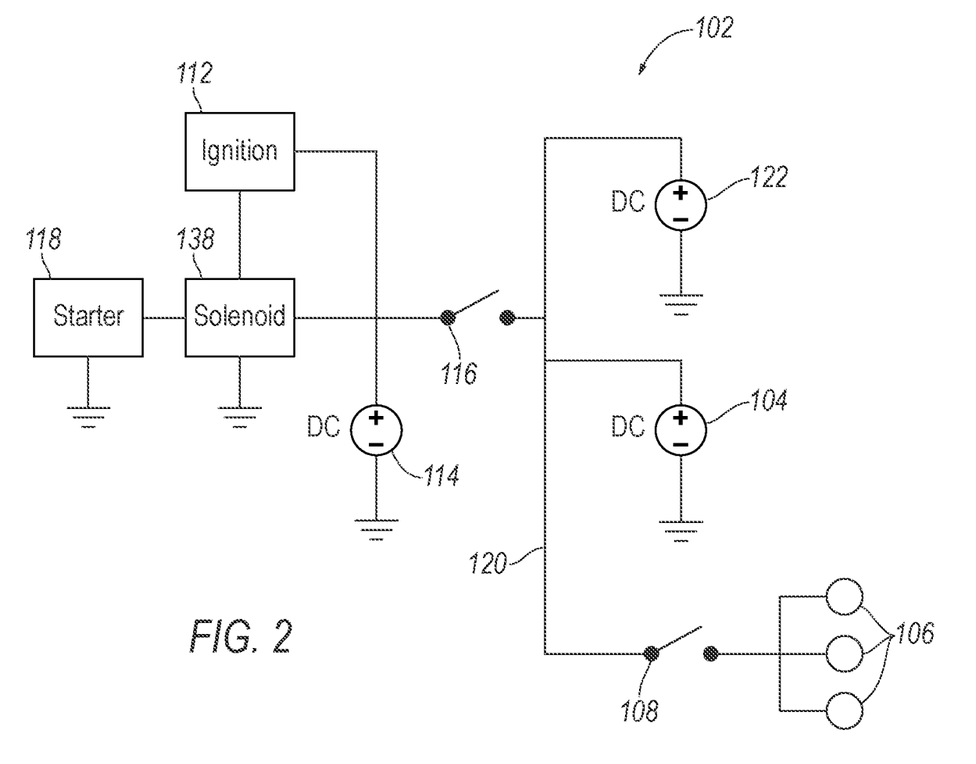
FIG. 2 is a circuit diagram of a vehicle electrical system of the vehicle.

With reference to FIG. 2, the first battery 114 may be of any suitable type for vehicular electrification, for example, lithium-ion batteries, nickel-metal hydride batteries, lead-acid batteries, or ultracapacitors, as used in, for example, internal-combustion-engine (ICE) vehicles, plug-in hybrid electric vehicles (PHEVs), hybrid electric vehicles (HEVs), or battery electric vehicles (BEVs).

The vehicle 100 includes the ignition 112. The ignition 112 can be movable by the operator between, e.g., an off state, an on state, an accessories state, and a starting state. For example, the ignition 112 can be a barrel rotatable between positions corresponding to the states, or the ignition 112 can be a push button that is in the starting state when pressed. The ignition 112 can be biased to move out of the starting position, e.g., by having a spring that rotationally biases the barrel from the starting position to the on position or biases the button from the pressed position to the unpressed position. The ignition 112 is electrically connected to the first battery 114. The first battery 114 is configured to supply power to a starter 118 in response to a signal from the ignition 112. For example, when the ignition 112 is in the starting state, the ignition 112 supplies power from the first battery 114 to a solenoid 138, causing the solenoid 138 to close and thereby complete a circuit for current to flow from the first battery 114 to the starter 118.

The starter 118 can start an engine or motor (not shown) of the vehicle 100. The starter 118 can be, e.g., an electric motor that rotates when a voltage is applied, e.g., by being electrically connected to the first battery 114.

The first switch 116 is electrically connected in series between the first battery 114 and the second battery 104. The first switch 116 is electrically connected in series between the first battery 114 and the second switch 108. For example, the first switch 116 is electrically connected in series between the first battery 114 and a node 120 directly connected to the second battery 104 and the second switch 108. When the first switch 116 is closed, current is permitted to flow between the first battery 114 and the second battery 104 and second switch 108. When the first switch 116 is open, the first battery 114 is electrically isolated from the second battery 104 and second switch 108.

The first switch 116 is switchable between closed and open. For example, the first switch 116 can be a relay, i.e., an electrically operated switch. The first switch 116 can switch from open to closed or vice versa in response to a signal, e.g., from the ignition 112 or the computer 110.

The first switch 116 can be configured to be open in response to the ignition 112 being in the off state. For example, when turning off, the ignition 112 can send a signal to the first switch 116 (directly or via the computer 110) to open. The customer connection points 106 thus do not draw down the first battery 114 when the vehicle 100 is not running. The first switch 116 can be configured to be closed in response to the ignition 112 being in the on state. For example, the ignition 112 can send a signal to the first switch 116 (directly or via the computer 110) to close when the ignition 112 is released after starting the vehicle 100. The motor can thus charge the second battery 104 along with the first battery 114 when the vehicle 100 is running.

The second battery 104 may be of any suitable type for vehicular electrification, for example, lithium-ion batteries, nickel-metal hydride batteries, lead-acid batteries, or ultracapacitors, as used in, for example, internal-combustion-engine (ICE) vehicles, plug-in hybrid electric vehicles (PHEVs), hybrid electric vehicles (HEVs), or battery electric vehicles (BEVs). The second battery 104 can have a lower capacity than the first battery 114.

The vehicle 100 may include a third battery 122. The third battery 122 may be of any suitable type for vehicular electrification, for example, lithium-ion batteries, nickel-metal hydride batteries, lead-acid batteries, or ultracapacitors, as used in, for example, internal-combustion-engine (ICE) vehicles, plug-in hybrid electric vehicles (PHEVs), hybrid electric vehicles (HEVs), or battery electric vehicles (BEVs). The third battery 122 can be connected in parallel to the second battery 104. The third battery 122 can be connected to the node 120 that is directly connected to the second battery 104, the second switch 108, and the first switch 116. The third battery 122 can have a lower capacity than the first battery 114 and a capacity equal to the second battery 104.

The second switch 108 is electrically connected in series between the second and third batteries 104, 122 and the customer connection points 106. When the second switch 108 is closed, current is permitted to flow between the second and third batteries 104, 122 and the customer connection points 106. When the first switch 116 is open, the customer connection points 106 are electrically isolated from the second and third batteries 104, 122.

The second switch 108 is switchable between closed and open. For example, the second switch 108 can be a relay, i.e., an electrically operated switch. The second switch 108 can switch from open to closed or vice versa in response to a signal, e.g., from the ignition 112 or the computer 110.

The vehicle electrical system 102 includes at least one customer connection point 106, e.g., a plurality of customer connection points 106. The customer connection points 106 are features to which the operator can electrically connect nonvehicle loads, i.e., electrical loads that are not part of the vehicle 100. When the second switch 108 is open, the second and third batteries 104, 122 supply electricity to the nonvehicle loads via the customer connection points 106.

Figure 3:
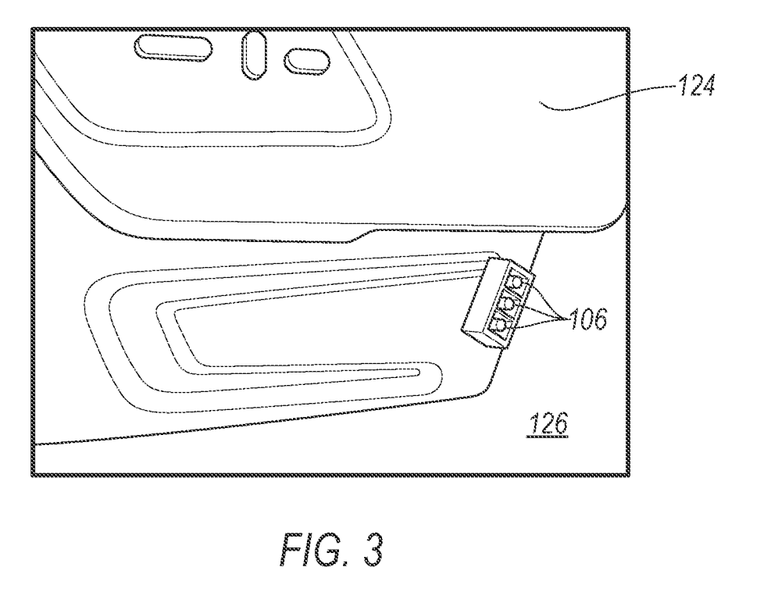
FIG. 3 is a perspective view of customer connection points of the vehicle electrical system.

With reference to FIG. 3, the customer connection points 106 can be located in a position on the vehicle 100 in which the customer connection points 106 are accessible to the operator and able to be covered when not in use. For example, the customer connection points 106 can be located at a bottom of a driver seat 124 in a passenger cabin 126 of the vehicle 100. Thus, a nonvehicle load located outside the vehicle 100 can be easily electrically connected to one of the customer connection points 106.

The customer connection points 106 can be any type of feature to which a nonvehicle load can be securely and temporarily attached. For example, as shown in FIG. 3, the customer connection points 106 are studs, to which the nonvehicle loads can be electrically connected by clipping or screwing.

Figure 4:
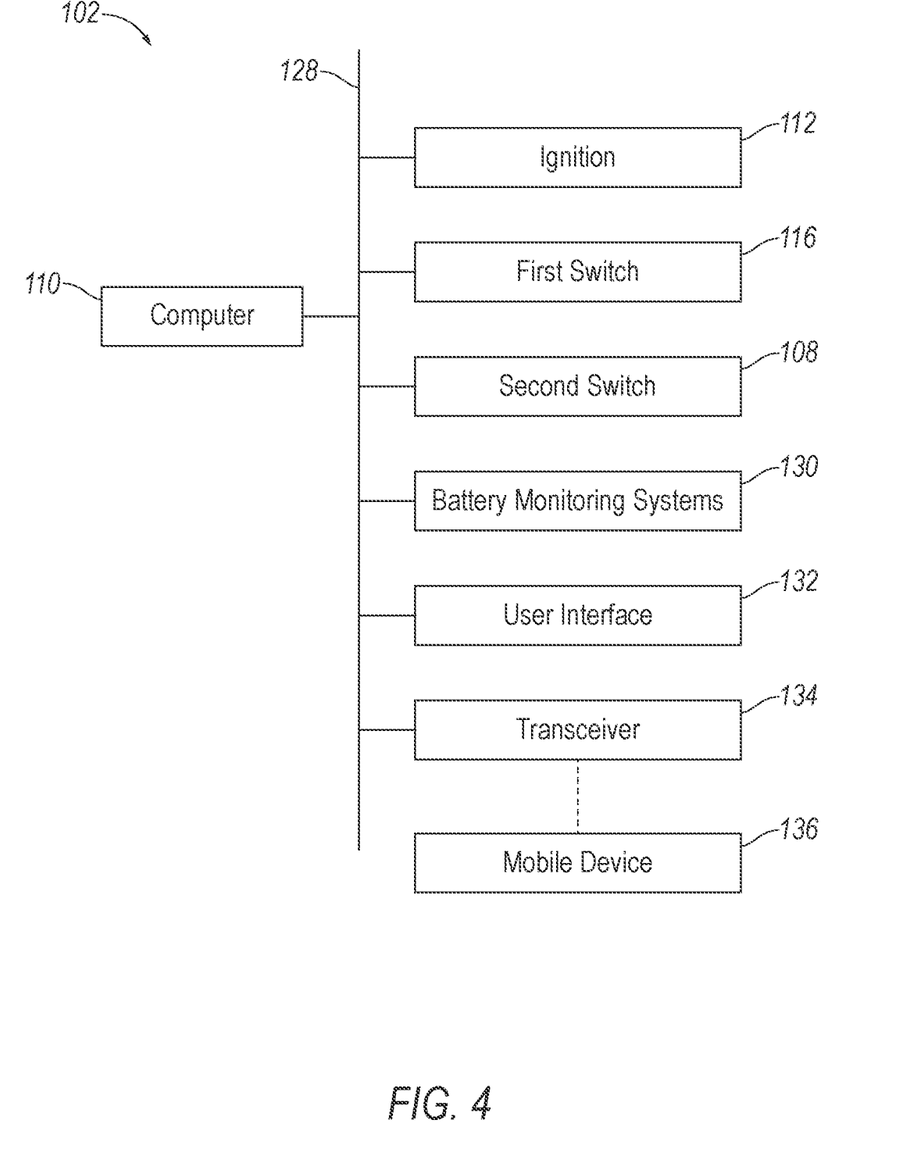
FIG. 4 is a block diagram of a control system of the vehicle electrical system.

With reference to FIG. 4, the computer 110 is a microprocessor-based computing device, e.g., a generic computing device including a processor and a memory, an electronic controller or the like, a field-programmable gate array (FPGA), an application-specific integrated circuit (ASIC), a combination of the foregoing, etc. Typically, a hardware description language such as VHDL (Very High Speed Integrated Circuit Hardware Description Language) is used in electronic design automation to describe digital and mixed-signal systems such as FPGA and ASIC. For example, an ASIC is manufactured based on VHDL programming provided pre-manufacturing, whereas logical components inside an FPGA may be configured based on VHDL programming, e.g., stored in a memory electrically connected to the FPGA circuit. The computer 110 can thus include a processor, a memory, etc. The memory of the computer 110 can include media for storing instructions executable by the processor as well as for electronically storing data and/or databases, and/or the computer 110 can include structures such as the foregoing by which programming is provided. The computer 110 can be multiple computers coupled together.

The computer 110 may transmit and receive data through a communications network 128 such as a controller area network (CAN) bus, Ethernet, WiFi, Local Interconnect Network (LIN), onboard diagnostics connector (OBD-II), and/or by any other wired or wireless communications network. The computer 110 may be communicatively coupled to the first switch 116, the second switch 108, battery monitoring systems 130, a user interface 132, a transceiver 134, and other components via the communications network 128.

The vehicle electrical system 102 can include the battery monitoring systems 130 for the first battery 114, the second battery 104, and the third battery 122. As is known, the battery monitoring systems 130 can detect voltage, current, temperature, etc. The battery monitoring systems 130 can calculate state of charge, state of health, number of cycles, etc. The state of charge is the quantity of charge remaining in a battery. The state of health is an actual condition of a battery compared to its ideal condition, e.g., capacity, voltage, internal resistance, etc.

The user interface 132 presents information to and receives information from the operator of the vehicle 100. The user interface 132 may be located, e.g., on an instrument panel in the passenger cabin 126 of the vehicle 100, or wherever may be readily seen by the operator. The user interface 132 may include dials, digital readouts, screens, speakers, and so on for providing information to the operator, e.g., human-machine interface (HMI) elements such as are known. The user interface 132 may include buttons, knobs, keypads, microphone, and so on for receiving information from the operator.

The transceiver 134 may be adapted to transmit signals wirelessly through any suitable wireless communication protocol, such as cellular, Bluetooth®, Bluetooth® Low Energy (BLE), ultra-wideband (UWB), WiFi, IEEE 802.11a/b/g/p, cellular-V2X (CV2X), Dedicated Short-Range Communications (DSRC), other RF (radio frequency) communications, etc. The transceiver 134 may be adapted to communicate with a remote server, that is, a server distinct and spaced from the vehicle 100. The remote server may be located outside the vehicle 100. For example, the remote server may be associated with another vehicle (e.g., V2V communications), an infrastructure component (e.g., V2I communications), an emergency responder, a mobile device 136 associated with the operator of the vehicle 100, etc. The transceiver 134 may be one device or may include a separate transmitter and receiver.

The mobile device 136 is a portable computing device such as a mobile phone, e.g., a smartphone, or a tablet. The mobile device 136 is a computing device including a processor and a memory. The mobile device 136 is associated with the vehicle 100, e.g., is owned and carried by a person who may be the operator or owner of the vehicle 100.

The vehicle electrical system 102 can open the second switch 108 in response to a state of charge of the second battery 104 and/or third battery 122 decreasing below the charge threshold, thus isolating the customer connection points 106 from the second and third batteries 104, 122. The charge threshold can be chosen to prevent the second battery 104 and/or third battery 122 from experiencing a deep discharge that may diminish a capacity of the second battery 104 and/or third battery 122. In addition to opening the second switch 108, the vehicle electrical system 102 can also start the ignition 112 of the vehicle 100 in response to the state of charge of the second battery 104 and/or third battery 122 decreasing below the charge threshold, permitting the second and third batteries 104, 122 to be recharged.

The charge threshold can vary based on the states of health of second battery 104 and third battery 122. The state of health is an actual condition of a battery compared to its ideal condition. For example, the state of health can be an actual charge capacity relative to an ideal or nominal charge capacity, e.g., of a newly manufactured battery, expressed as a percentage. For another example, the state of health can be a voltage of the battery, e.g., when fully charged, relative to an ideal or nominal voltage, e.g., of a newly manufactured battery that is fully charged, expressed as a percentage. For another example, the state of health can be a metric based on one or more measured values of the battery, e.g., internal resistance, capacity, voltage, self-discharge, ability to accept a charge, number of charge-discharge cycles, age of the battery, battery temperature, total energy charged and discharged, etc., as is known. The states of health of the batteries 104, 122 can be determined by the battery monitoring systems 130 or can be determined by the computer 110 based on data from the battery monitoring systems 130.

The computer 110 can determine the charge threshold based on the states of health. The charge threshold can increase as the state(s) of health of the second battery 104 and/or the third battery 122 decreases. For example, the computer 110 can determine the charge threshold to provide a buffer against a deep discharge, the risk of which increases as the state of health decreases.

The vehicle electrical system 102 can transmit the message to the operator at one or more time limits before the second switch 108 disconnects the customer connection points 106 from the second and third batteries 104, 122. The time limits can include the first time limit and a second time limit, both described below. The message can be provided via the transceiver 134 and mobile device 136. The message permits the operator to take some action before a nonvehicle load connected to one of the customer connection points 106 loses power from the second and third batteries 104, 122, e.g., starting the vehicle 100 to charge the second battery 104 and/or third battery 122, turning off the nonvehicle load, etc.

To determine when to transmit the message, the computer 110 determines a rate of discharge and a time to reach the charge threshold. The rate of discharge can be an electrical current detected by the battery monitoring systems 130 flowing to the customer connection points 106. The computer 110 can apply a rolling average to the electrical current to account for fluctuations in the electrical current. The time to reach the charge threshold is the rate of discharge divided by the difference between the state of charge and the charge threshold, i.e., $T=R/(SOC-Q_{th})$, in which T is the time to reach the charge threshold, R is the rate of discharge, SOC is the state of charge of the second battery 104 and/or third battery 122, and $Q_{th}$ is the charge threshold. The state of charge SOC can be detected by the battery monitoring systems 130. When the time T to reach the charge threshold decreases to equal one of the time limits, the computer 110 instructs the transceiver 134 to transmit the message to the remote server, e.g., the mobile device 136.

The first time limit can be selected by the operator and provided as an input to the computer 110, e.g., via the user interface 132 and/or the transceiver 134 and mobile device 136. The user interface 132 and/or mobile device 136 can display a range from a smallest time to a largest time, and the operator can select the first time limit from the range, e.g., by selecting one of a plurality of discrete times such as 2 hours, 3 hours, 4 hours, etc. or by typing in a value of the first time limit that is within the range. Because the time limit can be selected by the operator, the time limit can permit the operator sufficient time to start the vehicle 100 or prepare for disconnection.

The second time can be predetermined and stored in the memory of the computer 110. The second time limit can be chosen to notify the operator that disconnection of the customer connection points 106 is imminent, e.g., 5 minutes. The second time limit can be smaller than the first time limit, e.g., smaller than the smallest time of the range of possible first time limits.

The vehicle electrical system 102 can also instruct the transceiver 134 to transmit a message to the operator in response to the state of health of one of the batteries 104, 114, 122 being below a health threshold. The operator can then replace the battery 104, 114, 122 with the low state of health. The state of health is an actual condition of a battery compared to its ideal condition. For example, the state of health can be an actual charge capacity relative to an ideal or nominal charge capacity, e.g., of a newly manufactured battery, expressed as a percentage. For another example, the state of health can be a voltage of the battery, e.g., when fully charged, relative to an ideal or nominal voltage, e.g., of a newly manufactured battery that is fully charged, expressed as a percentage. For another example, the state of health can be a metric based on one or more measured values of the battery, e.g., internal resistance, capacity, voltage, self-discharge, ability to accept a charge, number of charge-discharge cycles, age of the battery, battery temperature, total energy charged and discharged, etc., as is known. The states of health of the batteries 104, 114, 122 can be determined by the battery monitoring system 130 or can be determined by the computer 110 based on data from the battery monitoring system 130.

The health threshold is a predetermined value stored in the memory of the computer 110 and expressed in the same units as the state of health. The health threshold can be different for the first battery 114 than for the second battery 104 and third battery 122. The health threshold can be chosen to be above a point at which the battery 104, 114, 122 is no longer suitable for its intended task, e.g., when the first battery 114 cannot reliably start the vehicle 100 or when the second battery 104 or third battery 122 cannot power a typical nonvehicle load for a period of time expected by a typical operator.

The vehicle electrical system 102 can also instruct the transceiver 134 to transmit a message to the operator in response to the rate of discharge of the second battery 104 and/or third battery 122 being above a rate threshold. The operator can then check the status of the nonvehicle loads drawing power from the second and third batteries 104, 122 and, e.g., disconnect one or more of the nonvehicle loads or adjust one or more of the nonvehicle loads to draw less power. The rate of discharge can be determined as described above. The rate threshold is a predetermined value stored in the memory of the computer 110 and expressed in the same units as the rate of discharge. The rate threshold can be chosen to indicate that the rate of discharge is close to tripping a fuse, is generating high temperatures in the vehicle electrical system 102, etc.

Figure 5:
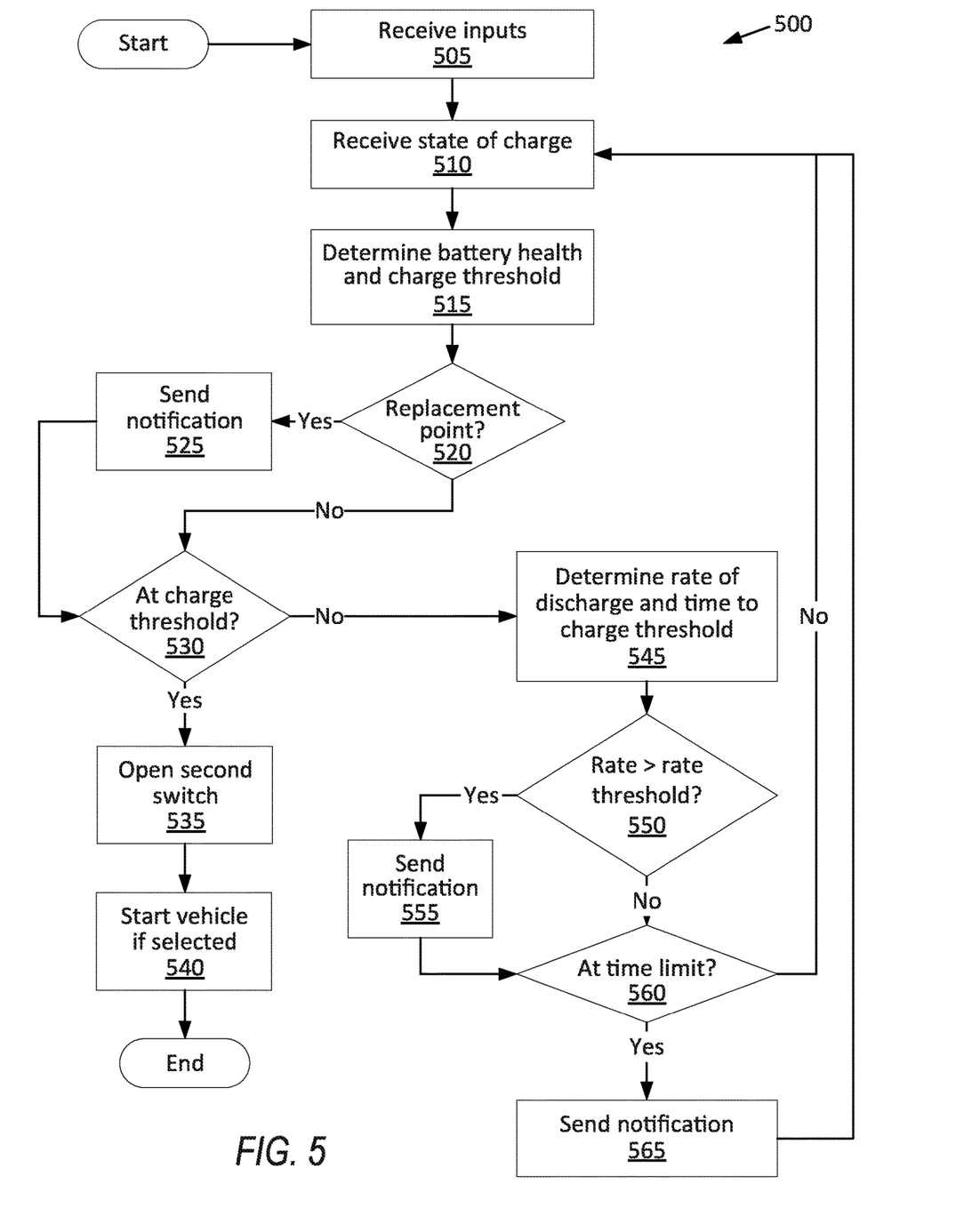
FIG. 5 is a process flow diagram of an example process for controlling the vehicle electrical system.

FIG. 5 is a process flow diagram illustrating an exemplary process 500 for controlling the vehicle electrical system 102. The memory of the computer 110 stores executable instructions for performing the steps of the process 500 and/or programming can be implemented in structures such as mentioned above. The process 500 executes while the ignition 112 of the vehicle 100 is off. As a general overview of the process 500, the computer 110 receives inputs of settings for controlling the vehicle electrical system 102. The computer 110 receives data from the battery monitoring systems 130 and determines the states of health and the charge threshold. If the state of health of the second battery 104 or third battery 122 is below the health threshold, the computer 110 instructs the transceiver 134 to transmit a message to the remote server, e.g., the mobile device 136. If the state of charge of the second battery 104 and/or third battery 122 decreases below the charge threshold, the computer 110 instructs the second switch 108 to open and, if selected by the operator, starts the ignition 112 of the vehicle 100. If the state of charge is still above the charge threshold, the computer 110 determines the rate of discharge and the time to reach the charge threshold. If the rate of discharge is above the rate threshold, the computer 110 instructs the transceiver 134 to transmit a message to the remote server, e.g., the mobile device 136. If the time to reach the charge threshold falls below the first time limit or the second time limit, the computer 110 instructs the transceiver 134 to transmits a message to the remote server, e.g., the mobile device 136. The process 500 repeats while the state of charge remains above the charge threshold.

The process 500 begins in a block 505, in which the computer 110 receives inputs of settings for the vehicle electrical system 102. One of the inputs can select the first time limit. The input can contain a selection of the first time limit from the range from the smallest time to the greatest time, as described above. Another of the inputs can select whether to start the ignition 112 in response to the state of charge of the second battery 104 or third battery 122 decreasing below the charge threshold, i.e., whether the computer 110 starts the ignition 112 or refrains from starting the ignition 112 in a block 540 below. The computer 110 can receive the inputs from the user interface 132 and/or can receive the inputs from the remote server, e.g., the mobile device 136, via the transceiver 134.

Next, in a block 510, the computer 110 receives the states of charge of the second battery 104 and the third battery 122 from the battery monitoring system 130.

Next, in a block 515, the computer 110 determines the states of health of the second battery 104 and the third battery 122 and determines the charge threshold based on the states of health, as described above.

Next, in a decision block 520, the computer 110 determines whether the state of health of the second battery 104 or the third battery 122 is below the health threshold, as described above. If the state of health is below the health threshold, the process 500 proceeds to a block 525. If the state of health is above the health threshold, the process 500 proceeds to a decision block 530.

In the block 525, the computer 110 instructs the transceiver 134 to transmit a message to the remote server, e.g., the mobile device 136, indicating that the state of health of the second battery 104 or the third battery 122 is below the health threshold. After the block 525, the process 500 proceeds to the decision block 530.

In the decision block 530, the computer 110 determines whether the state of charge of the second battery 104 and/or third battery 122 decreased below the charge threshold, as described above. In response to the state of charge decreasing below the charge threshold, the process 500 proceeds to a block 535. If the state of charge is still above the charge threshold, the process 500 proceeds to a block 545.

In the block 535, the computer 110 instructs the second switch 108 to open, isolating the customer connection points 106 from the second battery 104 and third battery 122.

Next, in a block 540, the computer 110 starts the ignition 112 if the input received in the block 505 selected to do so. If the input did not select to start the ignition 112, the computer 110 refrains from starting the ignition 112. After the block 540, the process 500 ends.

In the block 545, the computer 110 determines the rate of discharge and the time to reach the charge threshold, as described above.

Next, in a decision block 550, the computer 110 determines whether the rate of discharge is above the rate threshold, as described above. In response to the rate of discharge being above the rate threshold, the process 500 proceeds to a block 555. If the rate is discharge is below the rate threshold, the process 500 proceeds to a decision block 560.

In the block 555, the computer 110 instructs the transceiver 134 to transmit a message to the remote server, e.g., the mobile device 136, indicating that the rate of discharge is above the rate threshold. After the block 555, the process 500 proceeds to the decision block 560.

In the decision block 560, the computer 110 determines whether the state of charge of the second battery 104 or third battery 122 will decrease below the charge threshold in less than the first or second time limit from the current time, i.e., whether the time to reach the charge threshold determined in the block 545 has fallen below the first or second time limit. Upon determining that the state of charge of the second battery 104 or third battery 122 will decrease below the charge threshold in less than the first or second time limit, the process 500 proceeds to a block 565. If the state of charge will decrease below the charge threshold in a greater time than the first or second time limit (or the message in the block 565 has already been sent for the respective first or second time limit), the process 500 returns to the block 510 to continue monitoring the second battery 104 and third battery 122.

In the block 565, the computer 110 instructs the transceiver 134 to transmit a message to the remote server, e.g., the mobile device 136, indicating that the second battery 104 or third battery 122 will reach the charge threshold within the respective time limit from the current time. After the block 565, the process 500 returns to the block 510 to continue monitoring the second battery 104 and third battery 122.

In general, the computing systems and/or devices described may employ any of a number of computer operating systems, including, but by no means limited to, versions and/or varieties of the Ford Sync® application, AppLink/Smart Device Link middleware, the Microsoft Automotive® operating system, the Microsoft Windows® operating system, the Unix operating system (e.g., the Solaris® operating system distributed by Oracle Corporation of Redwood Shores, California), the AIX UNIX operating system distributed by International Business Machines of Armonk, New York, the Linux operating system, the Mac OSX and iOS operating systems distributed by Apple Inc. of Cupertino, California, the BlackBerry OS distributed by Blackberry, Ltd. of Waterloo, Canada, and the Android operating system developed by Google, Inc. and the Open Handset Alliance, or the QNX® CAR Platform for Infotainment offered by QNX Software Systems. Examples of computing devices include, without limitation, an on-board vehicle computer, a computer workstation, a server, a desktop, notebook, laptop, or handheld computer, or some other computing system and/or device.

Computing devices generally include computer-executable instructions, where the instructions may be executable by one or more computing devices such as those listed above. Computer executable instructions may be compiled or interpreted from computer programs created using a variety of programming languages and/or technologies, including, without limitation, and either alone or in combination, Java™, C, C++, Matlab, Simulink, Stateflow, Visual Basic, Java Script, Python, Perl, HTML, etc. Some of these applications may be compiled and executed on a virtual machine, such as the Java Virtual Machine, the Dalvik virtual machine, or the like. In general, a processor (e.g., a microprocessor) receives instructions, e.g., from a memory, a computer readable medium, etc., and executes these instructions, thereby performing one or more processes, including one or more of the processes described herein. Such instructions and other data may be stored and transmitted using a variety of computer readable media. A file in a computing device is generally a collection of data stored on a computer readable medium, such as a storage medium, a random access memory, etc.

A computer-readable medium (also referred to as a processor-readable medium) includes any non-transitory (e.g., tangible) medium that participates in providing data (e.g., instructions) that may be read by a computer (e.g., by a processor of a computer). Such a medium may take many forms, including, but not limited to, non-volatile media and volatile media. Instructions may be transmitted by one or more transmission media, including fiber optics, wires, wireless communication, including the internals that comprise a system bus coupled to a processor of a computer. Common forms of computer-readable media include, for example, RAM, a PROM, an EPROM, a FLASH-EEPROM, any other memory chip or cartridge, or any other medium from which a computer can read.

Databases, data repositories or other data stores described herein may include various kinds of mechanisms for storing, accessing, and retrieving various kinds of data, including a hierarchical database, a set of files in a file system, an application database in a proprietary format, a relational database management system (RDBMS), a nonrelational database (NoSQL), a graph database (GDB), etc. Each such data store is generally included within a computing device employing a computer operating system such as one of those mentioned above, and are accessed via a network in any one or more of a variety of manners. A file system may be accessible from a computer operating system, and may include files stored in various formats. An RDBMS generally employs the Structured Query Language (SQL) in addition to a language for creating, storing, editing, and executing stored procedures, such as the PL/SQL language mentioned above.

In some examples, system elements may be implemented as computer-readable instructions (e.g., software) on one or more computing devices (e.g., servers, personal computers, etc.), stored on computer readable media associated therewith (e.g., disks, memories, etc.). A computer program product may comprise such instructions stored on computer readable media for carrying out the functions described herein.

In the drawings, the same reference numbers indicate the same elements. Further, some or all of these elements could be changed. With regard to the media, processes, systems, methods, heuristics, etc. described herein, it should be understood that, although the steps of such processes, etc. have been described as occurring according to a certain ordered sequence, such processes could be practiced with the described steps performed in an order other than the order described herein. It further should be understood that certain steps could be performed simultaneously, that other steps could be added, or that certain steps described herein could be omitted.

All terms used in the claims are intended to be given their plain and ordinary meanings as understood by those skilled in the art unless an explicit indication to the contrary in made herein. In particular, use of the singular articles such as "a," "the," "said," etc. should be read to recite one or more of the indicated elements unless a claim recites an explicit limitation to the contrary. Use of "in response to" and "upon determining" indicates a causal relationship, not merely a temporal relationship. The adjectives "first," "second," and "third" are used throughout this document as identifiers and are not intended to signify importance, order, or quantity.

The disclosure has been described in an illustrative manner, and it is to be understood that the terminology which has been used is intended to be in the nature of words of description rather than of limitation. Many modifications and variations of the present disclosure are possible in light of the above teachings, and the disclosure may be practiced otherwise than as specifically described.

The invention claimed is:

1. A vehicle electrical system comprising:
   a battery;
   a customer connection point;
   a switch electrically connected in series between the battery and the customer connection point;
   a computer communicatively coupled to the switch; and
   a transceiver communicatively coupled to the computer;
   the computer being programmed to:
   instruct the switch to open in response to a state of charge of the battery decreasing below a charge threshold;
   receive an input from a user selecting a first time limit, wherein the input contains a selection of the first time limit from a range presented to the user, the range extending from a smallest time to a greatest time;
   instruct the transceiver to transmit a first message to a remote server upon determining that the state of charge of the battery will decrease below the charge threshold in less than the first time limit from a current time; and
   instruct the transceiver to transmit a second message to the remote server upon determining that the state of charge of the battery will decrease below the charge threshold in less than a second time limit from the current time, wherein the second time limit is less than the smallest time.

2. The vehicle electrical system of claim 1, wherein the computer is programmed to determine a state of health of the battery, and determine the charge threshold based on the state of health of the battery.

3. The vehicle electrical system of claim 2, wherein the charge threshold increases as the state of health of the battery decreases.

4. The vehicle electrical system of claim 1, wherein the battery is a second battery, the switch is a second switch, the vehicle electrical system further comprising a first battery and a first switch electrically connected in series between the first battery and the second battery.

5. The vehicle electrical system of claim 4, wherein the first switch is configured to be open in response to an ignition of a vehicle including the vehicle electrical system being off.

6. The vehicle electrical system of claim 4, wherein the first switch is electrically connected in series between the first battery and the second switch.

7. The vehicle electrical system of claim 4, further comprising an ignition electrically connected to the first battery, wherein the first battery is configured to supply power to a starter in response to a signal from the ignition.

8. The vehicle electrical system of claim 1, wherein the computer is further programmed to determine a state of health of the battery, and instruct the transceiver to transmit a third message to the remote server in response to the state of health of the battery being below a health threshold.

9. The vehicle electrical system of claim 1, wherein the computer is further programmed to start an ignition of a vehicle including the vehicle electrical system in response to the state of charge of the battery decreasing below the charge threshold.

10. The vehicle electrical system of claim 1, wherein the input is a first input, and the computer is further programmed to:
    receive a second input selecting whether to start an ignition of a vehicle including the vehicle electrical system in response to the state of charge of the battery decreasing below the charge threshold;
    start the ignition in response to the state of charge of the battery decreasing below the charge threshold and the second input selecting to start the ignition; and
    refrain from starting the ignition in response to the state of charge of the battery decreasing below the charge threshold and the second input selecting to not start the ignition.

11. The vehicle electrical system of claim 1, wherein the computer is programmed to determine a rate of discharge of the battery, and instruct the transceiver to transmit a third message to the remote server in response to the rate of discharge being above a rate threshold.

12. The vehicle electrical system of claim 1, wherein the second time limit is less than the first time limit.

13. The vehicle electrical system of claim 1, wherein the second time limit is predetermined, and the second time limit is less than the first time limit.

14. The vehicle electrical system of claim 1, wherein the remote server is a mobile device associated with a vehicle including the vehicle electrical system.

15. The vehicle electrical system of claim 1, wherein receiving the input includes receiving the input from the remote server via the transceiver.

16. The vehicle electrical system of claim 1, further comprising a plurality of customer connection points including the customer connection point, wherein the switch is electrically connected in series between the battery and the plurality of customer connection points.

17. The vehicle electrical system of claim 1, wherein the switch is a relay.

18. The vehicle electrical system of claim 1, wherein the customer connection point is shaped to receive an electrical connection to a nonvehicle load.

* * * * *